(12) United States Patent
Machii et al.

(10) Patent No.: US 10,401,449 B2
(45) Date of Patent: Sep. 3, 2019

(54) MAGNETIC RESONANCE IMAGING APPARATUS TO CALCULATE CURRENT IN AN EQUIVALENT CIRCUIT INCLUDING A GRADIENT COIL

(71) Applicant: Toshiba Medical Systems Corporation, Otawara-shi (JP)

(72) Inventors: Yutaka Machii, Nasushiobara (JP); Naoyuki Furudate, Otawara (JP); Sho Kawajiri, Nasushiobara (JP); Motohiro Miura, Yaita (JP)

(73) Assignee: Canon Medical Systems Corporation, Otawara-shi (JP)

( * ) Notice: Subject to any disclaimer, the term of this patent is extended or adjusted under 35 U.S.C. 154(b) by 102 days.

(21) Appl. No.: 15/222,459

(22) Filed: Jul. 28, 2016

(65) Prior Publication Data

US 2017/0045595 A1    Feb. 16, 2017

(30) Foreign Application Priority Data

Aug. 10, 2015 (JP) ................. 2015-158580

(51) Int. Cl.
  *G01R 33/54* (2006.01)
  *G01R 33/385* (2006.01)

(52) U.S. Cl.
  CPC ....... *G01R 33/3852* (2013.01); *G01R 33/543* (2013.01)

(58) Field of Classification Search
  CPC ............ G01R 33/3852; G01R 33/3854; G01R 33/4818; G01R 33/385; G01R 33/543; G01R 33/4822
  See application file for complete search history.

(56) References Cited

U.S. PATENT DOCUMENTS

| 5,436,564 | A | * | 7/1995 | Kreger | ................. | A61B 5/0424 128/901 |
| 2013/0009641 | A1 | | 1/2013 | Hori et al. | | |
| 2014/0300362 | A1 | | 10/2014 | Kawajiri et al. | | |

FOREIGN PATENT DOCUMENTS

| JP | 2009-240526 | 10/2009 |
| JP | 2013-173 | 1/2013 |
| JP | 2013-75060 | 4/2013 |
| JP | 2014-30714 | 2/2014 |

* cited by examiner

*Primary Examiner* — Minh N Tang
(74) *Attorney, Agent, or Firm* — Oblon, McClelland, Maier & Neustadt, L.L.P.

(57) ABSTRACT

A magnetic resonance imaging apparatus according to an embodiment includes a processing circuit and a sequence control circuit. The processing circuit calculates, based on an imaging sequence to be executed in magnetic resonance imaging, a value of a current flowing through a closed circuit by using an equivalent circuit and determines, prior to an execution of the imaging sequence, based on the value of the current, whether it is acceptable to execute the imaging sequence. The sequence control circuit executes the imaging sequence. The equivalent circuit is an equivalent circuit for a circuit that includes a gradient coil and that has a first circuit and a second circuit. The first circuit is connected to a power supply and has self-inductance. The second circuit includes at least one closed circuit having mutual inductance with the first circuit.

13 Claims, 10 Drawing Sheets

MAGNETIC RESONANCE IMAGING APPARATUS TO CALCULATE CURRENT IN AN EQUIVALENT CIRCUIT INCLUDING A GRADIENT COIL

CROSS-REFERENCE TO RELATED APPLICATIONS

This application is based upon and claims the benefit of priority from Japanese Patent Application No. 2015-158580, filed on Aug. 10, 2015; the entire contents of which are incorporated herein by reference.

FIELD

Embodiments described herein relate generally to a magnetic resonance imaging apparatus and a magnetic resonance imaging method.

BACKGROUND

A gradient magnetic field generating system used for magnetic resonance imaging has a limit of usage in terms of electrical power. One method for avoiding this is to supply a current to gradient coils such that the amount of the current supplied to the gradient magnetic field generating system becomes unquestionably lower than the limit of usage in terms of the electrical power of the gradient magnetic field generating system, thereby safely actuating the gradient magnetic field generating system.

However, if the gradient power supply device has a surplus of power supplying capacity, the image would have been imaged under more favorable conditions, for example, by increasing the number of slices in accordance with the surplus. Precisely estimating the limit of usage of the gradient magnetic field generating system in terms of the electrical power in accordance with the imaging sequence would make it possible for a magnetic resonance imaging apparatus to flow the maximum possible gradient magnetic field current within the range of the limit of usage in terms of the electrical power and to elicit the maximized performance of the gradient magnetic field generating system.

DETAILED DESCRIPTION

A magnetic resonance imaging apparatus according to an embodiment includes a processing circuit and a sequence control circuit. The processing circuit calculates, based on an imaging sequence to be executed in magnetic resonance imaging, a value of a current flowing through a closed circuit by using an equivalent circuit and determines, prior to an execution of the imaging sequence, based on the value of the current, whether it is acceptable to execute the imaging sequence. The sequence control circuit executes the imaging sequence when the processing circuit determines that it is acceptable to execute the imaging sequence. The equivalent circuit is an equivalent circuit for a circuit that includes a gradient coil and that has a first circuit and a second circuit. The first circuit is connected to a power supply and has self-inductance. The second circuit includes at least one closed circuit having mutual inductance with the first circuit.

A magnetic resonance imaging apparatus according to embodiments will be described in details below with reference to the accompanying drawings.

First Embodiment

Figure 1:
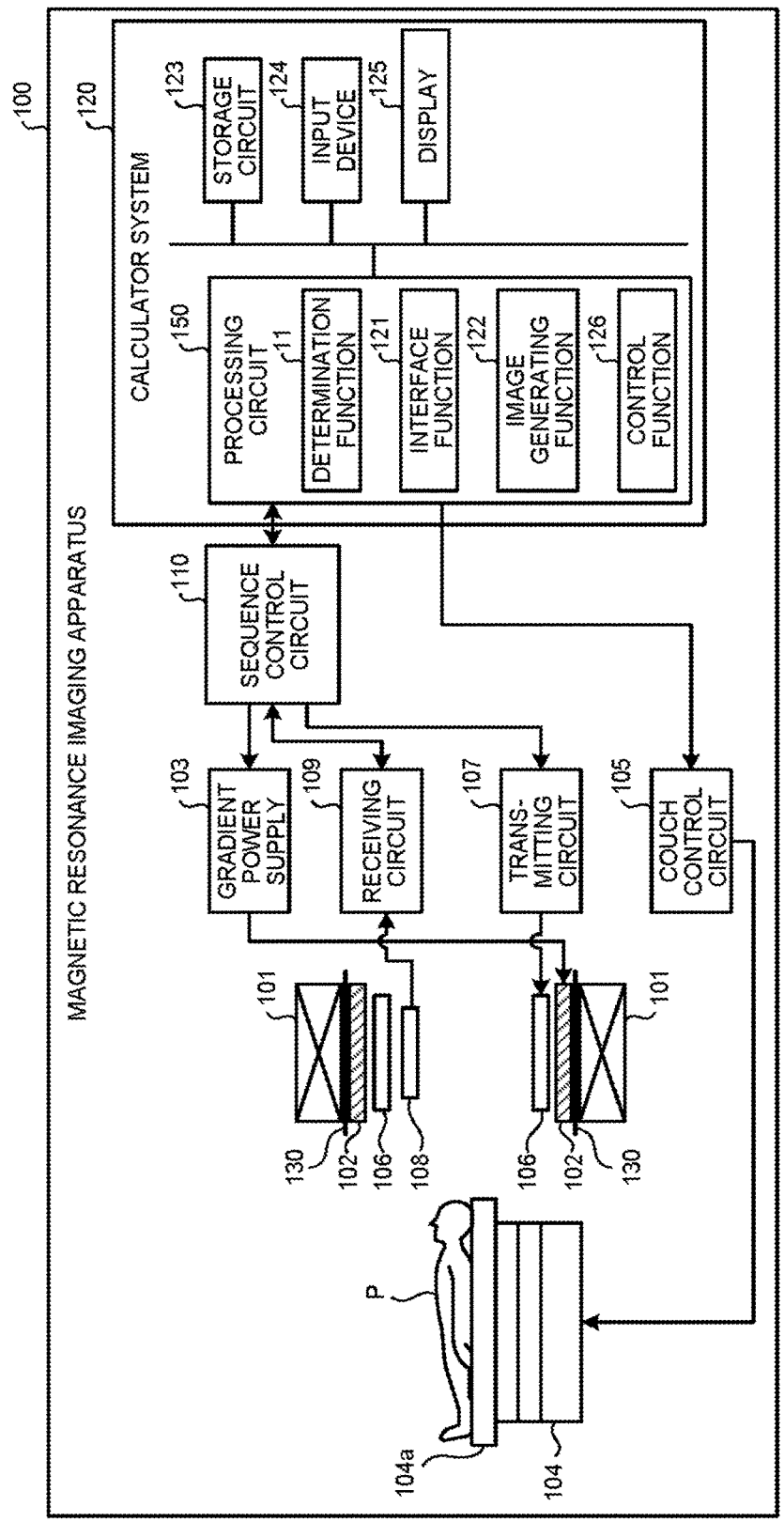
FIG. 1 is a block diagram illustrating a configuration of a magnetic resonance imaging apparatus according to a first embodiment.

Referring to FIG. 1, an overall configuration of a magnetic resonance imaging apparatus according to a first embodiment will be described. FIG. 1 is a block diagram showing a configuration of the magnetic resonance imaging apparatus according to the first embodiment.

As illustrated in FIG. 1, a magnetic resonance imaging apparatus 100 includes a static field magnet 101, a shim coil 130, a gradient coil 102, a gradient power supply 103, a couch 104, a couch control circuit 105, a transmitting coil 106, a transmitting circuit 107, a receiving coil 108, a receiving circuit 109, a sequence control circuit 110, and a calculator system 120. The magnetic resonance imaging apparatus 100 does not include a subject P (for example, human body).

The static field magnet 101 is a hollow cylindrical magnet and produces a uniform static magnetic field in its internal space. The static field magnet 101 is, for example, a permanent magnet or a superconducting magnet.

The shim coil 130 is a hollow cylindrical coil formed on the inside of the static field magnet 101 and is connected to a shim coil power supply not-illustrated to make the static magnetic field produced by the static field magnet 101 uniform, by the power supply supplied from the shim coil power supply.

Figure 2:
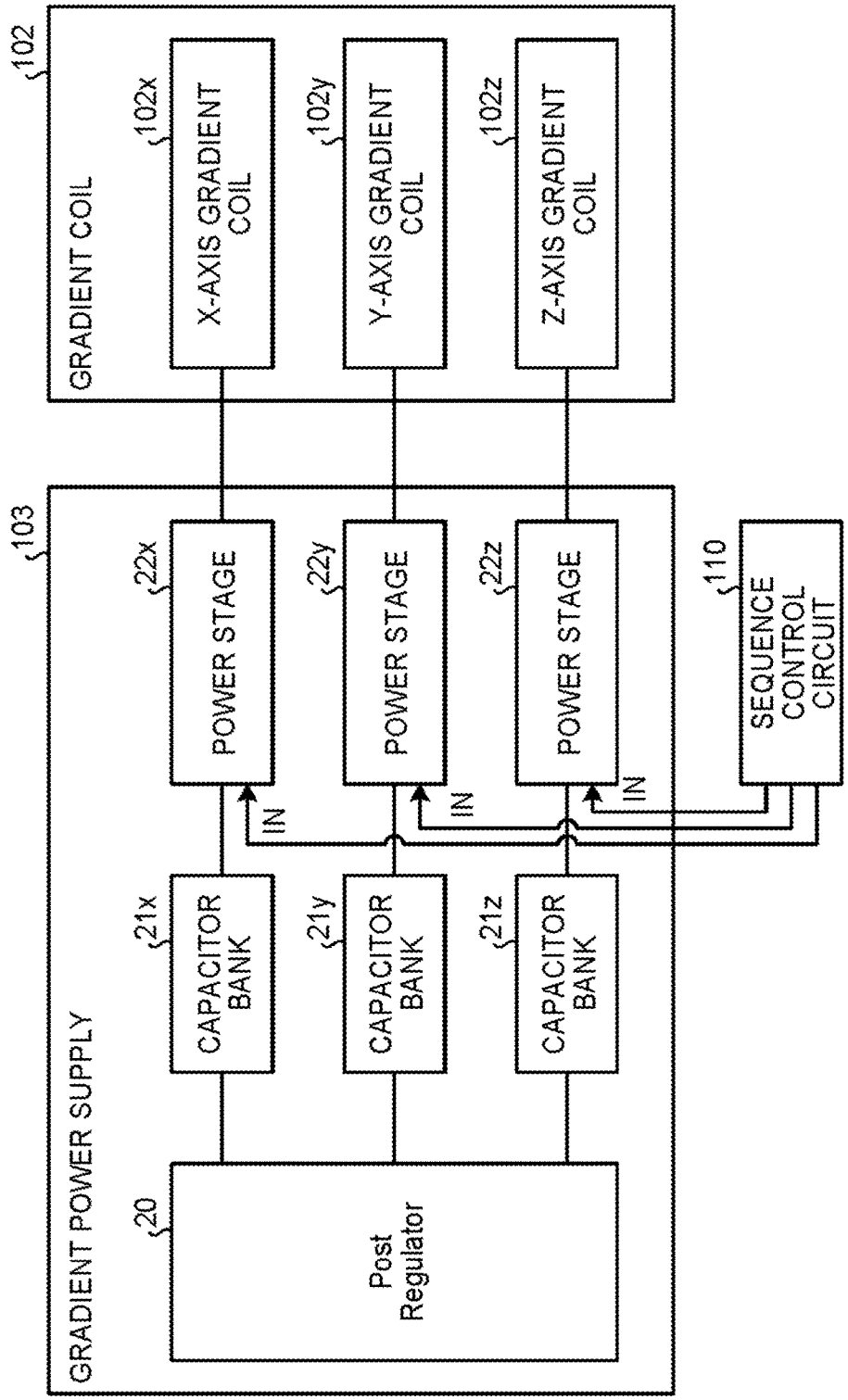
FIG. 2 is a block diagram illustrating a configuration including a gradient power supply according to the first embodiment.

The gradient coil 102 is a hollow cylindrical coil disposed on the inside of the static field magnet 101 and the shim coil 130. The gradient coil 102 is formed with a combination of three coils (an x-axis gradient coil 102$x$, a y-axis gradient coil 102$y$, and a z-axis gradient coil 102$z$) corresponding to the X, Y, and Z axes orthogonal to each other, as illustrated in FIG. 2. These three coils individually receive currents from the gradient power supply 103 to produce gradient magnetic fields in which magnetic field intensities vary along the X, Y, and Z axes. The Z-axis direction is the same direction as the static magnetic field. The Y-axis direction is the vertical direction, and the X-axis direction is the direction perpendicular to the Z axis and the Y axis.

The X, Y, and Z-axis gradient magnetic fields produced by the gradient coil 102 generate, for example, a gradient magnetic field for slice selection Gs, a gradient magnetic field for phase encoding Ge, and a gradient magnetic field for read-out Gr. The gradient magnetic field for slice selection Gs is used for determining any given imaging cross section. The gradient magnetic field for phase encoding Ge is used for changing the phase of an MR signal in accordance with the spatial position. The gradient magnetic field for read-out Gr is used for changing the frequency of the MR signal in accordance with the spatial position.

The gradient power supply 103 supplies a current to the gradient coil 102. This configuration will be described later with reference to FIG. 2.

The couch 104 includes a couchtop 104a on which a subject P lies. The couchtop 104a is inserted into the bore (the imaging bore) of the gradient coil 102 with the subject P lying thereon, under the control of the couch control circuit 105. The couch 104 is typically installed such that its longitudinal direction is parallel to the central axis of the static field magnet 101. The couch control circuit 105 drives the couch 104 to move the couchtop 104a in the longitudinal direction and the up/down direction under the control of the calculator system 120.

The transmitting coil 106 is disposed on the inside of the gradient coil 102 and is supplied with a radio frequency (RF) pulse from the transmitting circuit 107 to produce a high-frequency magnetic field. The transmitting circuit 107 supplies an RF pulse corresponding to the Larmor frequency specified by the kind of target nuclei and the magnitude of the magnetic field, to the transmitting coil 106.

The receiving coil 108 is disposed on the inside of the gradient coil 102 and receives an MR signal produced from the subject P by the effect of the high-frequency magnetic field. Upon receiving the MR signal, the receiving coil 108 outputs the received MR signal to the receiving circuit 109. For example, the receiving coil 108 is a coil array including one or more, typically, a plurality of coil elements.

The receiving circuit 109 generates MR data based on the MR signal output from the receiving coil 108. Specifically, the receiving circuit 109 performs signal processing including pre-amplification, intermediate frequency conversion, phase detection, low frequency amplification, and filtering on the MR signal output from the receiving coil 108 and then performs analog-digital conversion on the processed data. The receiving circuit 109 thus generates the MR data, which is digitalized complex data. The MR data generated by the receiving circuit 109 is also called raw data.

The receiving circuit 109 transmits the generated MR data to the sequence control circuit 110. The receiving circuit 109 may be included in the gantry including the static field magnet 101 and the gradient coil 102.

In the first embodiment, the MR signals output from the coil elements in the receiving coil 108 are distributed and synthesized appropriately to be output in units of channels, for example, to the receiving circuit 109. The MR data is thus handled for each channel in the processing in a stage subsequent to the receiving circuit 109.

The total number of channels may be equal to the total number of coil elements, or the total number of channels may be smaller than the total number of coil elements, or conversely, the total number of channels may be greater than the total number of coil elements. The timing of distribution and synthesis is not limited to the above-described timing. The MR signals or the MR data is distributed and synthesized in the units of channels prior to the processing performed by the image generating function 122 to be described later.

The sequence control circuit 110 drives the gradient power supply 103, the transmitting circuit 107 and the receiving circuit 109 to image the subject P, based on information of the imaging sequence transmitted from the calculator system 120.

The imaging sequence is a pulse sequence corresponding to each of a plurality of protocols included in the examination by the magnetic resonance imaging apparatus 100. The information of the imaging sequence defines, for example, the intensity of power supply supplied by the gradient power supply 103 to the gradient coil 102 and the timing of supplying power supply, the intensity of an RF pulse transmitted by the transmitting circuit 107 to the transmitting coil 106 and the timing of applying the RF pulse, and the timing at which the receiving circuit 109 detects the MR signal.

As a result of driving the gradient power supply 103, the transmitting circuit 107 and the receiving circuit 109, the shim coil power supply and the like to image the subject P, the sequence control circuit 110 receives MR data from the receiving circuit 109 and then transfers the received MR data to the calculator system 120.

The magnetic resonance imaging apparatus may include a temperature sensor not illustrated. The temperature sensor is, for example, a thermometer for acquiring a temperature. The temperature sensor acquires a temperature at the place where the temperature sensor is installed, and then transmits the temperature information to the sequence control circuit 110.

The sequence control circuit 110 receives the temperature information from the temperature sensor and then transmits the temperature information to a processing circuit 150 in the calculator system 120. The processing circuit 150 acquires the temperature through the sequence control circuit 110.

The temperature sensor may be a non-contact thermometer such as an infrared thermometer or may be a contact thermometer such as a thermistor thermometer or a thermocouple thermometer.

The calculator system 120 performs, for example, an overall control of the magnetic resonance imaging apparatus 100, data acquisition, and image generation. The calculator system 120 includes the processing circuit 150, a storage circuit 123, an input device 124, and a display 125. The processing circuit 150 includes a determination function 11, an interface function 121, an image generating function 122, and a control function 126.

In the first embodiment, the processing functions performed by the determination function 11, the interface function 121, the image generating function 122, and the control function 126 are stored in the form of computer-executable programs in the storage circuit 123. The processing circuit 150 is a processor that reads out each program from the storage circuit 123 to implement the function corresponding to the program. In other words, the processing circuit 150 in a state of having read each program has the corresponding function illustrated in the processing circuit 150 in FIG. 1. In FIG. 1, a single processing circuit 150 implements the processing functions performed in the determination function 11, the interface function 121, the image generating function 122, and the control function 126. However, a plurality of independent processors may be combined to configure the processing circuit 150, and each processor may execute a computer program to implement the corresponding function.

In other words, the functions as described above may be configured in the form of programs, and a single processing circuit may execute each program. Alternatively, a specific function may be implemented by a dedicated independent program-executing circuit. The determination function 11 in the processing circuit 150 and the sequence control circuit 110 are an example of the determination unit and the sequence controller, respectively.

As used in the foregoing description, the term "processor" means, for example, a central processing unit (CPU), a graphical processing unit (GPU), or circuitry such as an application specific integrated circuit (ASIC) and a programmable logic device (for example, a simple programmable logic device (SPLD), a complex programmable logic device (CPLD), and a field programmable gate array (FPGA)). The processor implements a function by reading and executing a computer program stored in the storage circuit 123. A program may be directly built in a circuit in the processor, rather than storing a computer program in the storage circuit 123. In this case, the processor implements a function by reading and executing a computer program built in the circuit. Similarly, the couch control circuit 105, the transmitting circuit 107, the receiving circuit 109, and the like are configured with an electronic circuit such as a processor as described above.

The processing circuit 150 allows the determination function 11 to determine whether an imaging sequence is executable, prior to the execution of the imaging sequence. Specific processing performed by the determination function 11 will be described later.

The processing circuit 150 transmits information of an imaging sequence to the sequence control circuit 110 through the interface function 121 and receives MR data from the sequence control circuit 110. Upon receiving MR data through the interface function 121, the processing circuit 150 stores the received MR data into the storage circuit 123.

The processing circuit 150 allows the image generating function 122 to generate an image using the MR data received through the interface function 121 and/or data stored in the storage circuit 123. The processing circuit 150 transmits the image obtained by the image generating function 122 to the display 125 and/or the storage circuit 123 as necessary.

The processing circuit 150 allows the control function 126 to perform an overall control of the magnetic resonance imaging apparatus 100. For example, the processing circuit 150 allows the control function 126 to generate information of the imaging sequence, based on the imaging conditions input from the operator through the input device 124, and transmit the generated information of the imaging sequence to the sequence control circuit 110 to control the imaging.

The storage circuit 123 stores, for example, the MR data received by the processing circuit 150 through the interface function 121 and the image data generated by the image generating function 122. The storage circuit 123 is, for example, a semiconductor memory device such as a random access memory (RAM) or a flash memory, a hard disk, or an optical disc.

The input device 124 accepts various instructions and information input from the operator. The input device 124 is, for example, a pointing device such as a mouse or a track ball, or an input device such as a keyboard.

The display 125 displays various types of information such as image data under the control of the control function 126 in the processing circuit 150. The display 125 is, for example, a display device such as a liquid crystal display.

The overall configuration of the magnetic resonance imaging apparatus 100 according to an embodiment has been described above. The processing of the gradient power supply 103 supplying current to the gradient coil 102 will now be described with reference to FIG. 2. FIG. 2 is a block diagram illustrating a configuration including the gradient power supply 103 according to the first embodiment.

As illustrated in FIG. 2, for example, the gradient power supply 103 includes a post regulator 20, capacitor banks 21*x* to 21*z*, and power stages 22*x* to 22*z*.

The post regulator 20 is a device serving as a power supply for supplying power to the power stages 22*x* to 22*z* to be described later. The post regulator 20 supplies power necessitated by the power stages 22*x* to 22*z* in accordance with the operation of the power stages 22*x* to 22*z*. A specific example of the post regulator 20 is a predetermined direct-current power supply obtained by rectifying alternating-current power supply. The post regulator 20 is, for example, a direct-current power supply having a constant voltage (CV)/constant current (CC) characteristic. In this case, the post regulator 20 functions as a constant-current source if a load on the subsequent stage is large, whereas the post regulator 20 functions as a constant-voltage source if a load on the subsequent stage is small. It is noted that the post regulator 20 functions as a constant-current source in a situation described in the following embodiment, in which a load on the subsequent stage is large.

The capacitor banks 21*x* to 21*z* are capacitors serving as batteries responsible for supplementing power supply of the post regulator 20. The capacitor bank 21*x*, the capacitor bank 21*y*, and the capacitor bank 21*z* are capacitor banks corresponding to the x-axis gradient coil 102*x*, the y-axis gradient coil 102*y*, and the z-axis gradient coil 102*z*, respectively. A configuration example of the capacitor banks 21*x* to 21*z* is an electrolytic capacitor. The capacitor banks 21*x* to 21*z* are connected to the post regulator 20 and the respective power stages 22*x* to 22*z* to temporarily store power input from the post regulator 20 and discharge the stored power to the power stages 22*x* to 22*z*, if necessary.

The role of the capacitor banks is as follows. When it is necessary to supply a large current to all of the gradient coils 102*x* to 102*z* in a short time, the required amount of power supply may temporarily exceed the power that the post regulator 20 is able to supply. In such a case, the presence of the capacitor banks 21*x* to 21*z* enables stable power supply to the gradient coils 102*x* to 102*z*.

The power stages 22*x* to 22*z* are amplifiers for converting a sequence waveform into a large-current pulse. The power stage 22*x*, the power stage 22*y*, and the power stage 22*z* are amplifiers corresponding to the x-axis gradient coil 102*x*, the y-axis gradient coil 102*y*, and the z-axis gradient coil 102*z*, respectively. The power stages 22*x* to 22*z* receive a control signal corresponding to a sequence waveform from the sequence control circuit 110, amplify and convert the received control signal into a large-current pulse, and output the large-current pulse to the gradient coil 102.

As described above, the gradient power supply 103 supplies current necessary for executing an imaging sequence to the gradient coil 102.

Backgrounds on the magnetic resonance imaging apparatus 100 according to an embodiment will now be described. The energy balance in the gradient magnetic field generating system including the gradient power supply 103 and the gradient coil 102 is expressed by Equation (1) below:

$$E_a^{total} + E_g^{total} = E_c^{total} + E_p^{total} \tag{1}$$

where $E_a^{total}$ is the energy consumed in the power stages 22x, 22y, and 22z; $E_g^{total}$ is the energy consumed in the gradient coils 102x, 102y, and 102z; $E_c^{total}$ is the energy supplied from the capacitor banks 21x, 21y, and 21z to the gradient coils 102x, 102y, and 102z; and $E_p^{total}$ is the energy supplied from the post regulator 20. Equation (1) represents the law of conservation of the energy in which the supplied energy is equal to the consumed energy in the gradient magnetic field generating system.

$E_c^{total}$ is specifically expressed by Equation (2):

$$E_c^{total} = \frac{1}{2}CV_c(0)^2 - \frac{1}{2}CV_c(t)^2 \quad (2)$$

where C is the capacitance of the capacitor banks 21x, 21y, and 21z; $V_c(t)$ is the voltage of the capacitor banks 21x, 21y, and 21z at time t; and $V_c(0)$ is the voltage of the capacitor banks 21x, 21y, and 21z at t=0, that is, in an initial state.

$E_p^{total}$ is specifically expressed by Equation (3):

$$E_p^{total} = \int_0^t V_c(t')I_p(t')dt' \quad (3)$$

where $I_p(t')$ is a value of the current supplied from the post regulator 20 at time t'. In the embodiment described below, the post regulator 20 operates such that the value of the supplied current retains a predetermined value.

$E_a^{total}$ is expressed by, for example, Equation (4):

$$E_a^{total} = \int_0^t (\alpha I(t')^2 + \beta I(t') + \gamma)dt' \quad (4)$$

where I(t') is a value of the current output from the power stages 22x, 22y, and 22z at time t'. At the same time, this is also the value of the current supplied to the gradient coils 102x, 102y, and 102z. Here, α, β, and γ are predetermined parameters calculated empirically.

In short, although the power stages 22x, 22y, and 22z actually consist of complicated circuits, their total consumption energy is thought to be associated with the final output current I(t'). Their effects are expressed by, for example, coefficients α, β, and γ. Specifically, γ is the consumption energy in the power stages 22x, 22y, and 22z when the output current I(t') is 0, β is the portion of the consumption energy in the power stages 22x, 22y, and 22z that is linear for the output current I(t'), and α is a coefficient obtained by calculating the portion of the consumption energy in the power stages 22x, 22y, and 22z that is nonlinear for the output current I(t') on the assumption that the second-order nonlinear effect is dominant for the output current I(t').

The output current I(t') corresponds to the waveform of the gradient magnetic field. Conversely, if the waveform of the gradient magnetic field is specified, that is, if the waveform of the gradient magnetic field is specified, the output current I(t') is specified. Consequently, when the imaging sequence is specified, the output current I(t') is a known variable.

$E_g^{total}$ can be written as a function as represented by Equation (5):

$$E_g^{total} = \int_0^t f(R(\omega), I(t'))dt' \quad (5)$$

where R is a resistance; ω is a frequency; and f is a predetermined function. That is, the energy consumed in the gradient coils 102x, 102y, and 102z is the integral of the consumption energy at time t' with respect to time, which is a function of current I(t') flowing through the gradient coils 102x, 102y, and 102z at time t'. The consumption energy at time t' depends on the current I(t'), and the resistance R serving as an equivalent circuit for the gradient coils 102x, 102y, and 102z depends on the frequency ω. Equation (5) is a nominal expression, and the specific formula of the energy consumed in the gradient coils 102x, 102y, and 102z will be described later.

Equation (1) representing the law of conservation of the energy and Equation (2) to Equation (5) representing energies will now be summarized. In these equations, C, α, β, and γ are predetermined parameters and known variables. $I_p$ is a known variable specified from the specifications of the post regulator 20. I is a known variable specified in accordance with the waveform of the gradient magnetic field to be determined whether to be executed. Furthermore, f and R(ω) are known variables specified from the properties of the equivalent circuit as described later. Therefore, the unknown variable is Vc alone. If the initial value of Vc at t=0 is specified, the processing circuit 150 can allow the determination function 11 to calculate the value of the voltage $V_c(t)$ of the capacitor banks 21x to 21z at time t by forming a set of Equation (1) and Equations (2) to (5).

A first background on the magnetic resonance imaging apparatus 100 according to the embodiment is that the actual gradient coils 102x to 102z have complicated electrical and magnetic properties.

An example of such property is, first of all, skin effect. As used herein, "skin effect" refers to an effect in which, when alternating current flows in a conductor, the current density is high on the surface of the conductor and the current density decreases as being away from the surface of the conductor. When a high-frequency current flows through the conductor, due to the electromotive force originating from the mutual inductance within the conductor, electronic currents are screened, resulting in a decrease of the current density. Consequently, as for alternating current, the current density is concentrated on a shallow region extending to the extent of the skin depth, causing the electrical resistance to increase. Typically, as the skin effect, the electrical resistance for alternating current increases, proportionally to the square root of the frequency ω.

Another example of such property is heat loss due to eddy currents. As used herein, "eddy currents" are induced currents generated within a conductor by a rapidly changing magnetic field. Eddy currents produced in a conductor transform into Joule heat in the conductor, causing the gradient coil 102 to generate heat.

An equivalent circuit model that replicates the characteristics of the gradient coil 102 can be made most simply by representing the gradient coil 102 by an equivalent circuit including a coil resistance R and a self-inductance L of the coil connected in series. Such a model, which merely represents the gradient coil 102 by a series circuit of a coil resistance, fails to fully replicate the characteristics of the actual gradient coil 102 as described above.

The energy consumed in the gradient coil 102 may be calculated most simply by assuming that the gradient coil 102 itself has a predetermined coil resistance, and calculating energy (Joule heat) consumed in the coil resistance connected to the gradient power supply 103. This method, in which energy consumed in the resistance connected to the gradient power supply 103 alone is counted as energy consumed in the gradient coil 102, fails to fully replicate the energy consumed in the actual gradient coil 102. More specifically, the resistance introduced for the purpose of explaining the energy consumed in the gradient coil 102 does not always directly cause a voltage drop in the circuit connected to the gradient power supply 103.

A second background on the magnetic resonance imaging apparatus 100 according to an embodiment is that computational load should be taken into consideration in estimating the voltage of the capacitor banks $21x$ to $21z$. For example, to estimate a voltage drop of the capacitor banks $21x$ to $21z$, a differential equation can be formed on the assumption that the voltage drop in the output voltage of the power stages $22x$ to $22z$ is caused by the mutual inductance with a virtual coil magnetically connected to the gradient coil 102. Directly solving this differential equation, however, involves a large computational load and may cause numerical instability. A method involving less computational load is therefore desired.

A third background on the magnetic resonance imaging apparatus 100 according to an embodiment is that the waveform (temporal change) of the gradient magnetic field often has a behavior that is generally non-differentiable or inappropriate for defining differential coefficients. For example, typical waveforms of the gradient magnetic field often include a Dirac delta-function-like waveform or a Heaviside step-function-like waveform. The expression derived from a set of Equation (1) and Equations (2) to (5) is an integral equation with respect to time t and thus can be differentiated with respect to time t to obtain a differential equation. The resultant differential equation can be solved by a predetermined method and can be expressed by a function using a predetermined differential coefficient. Using the method using the differential equation, however, causes numerical instability, because setting a differential coefficient is inappropriate for the waveform of the gradient magnetic field. It is therefore desired to divide the imaging sequence into a plurality of piecewise continuous functions and make a numerical evaluation with a subtraction equation defined for each interval.

Figure 3:
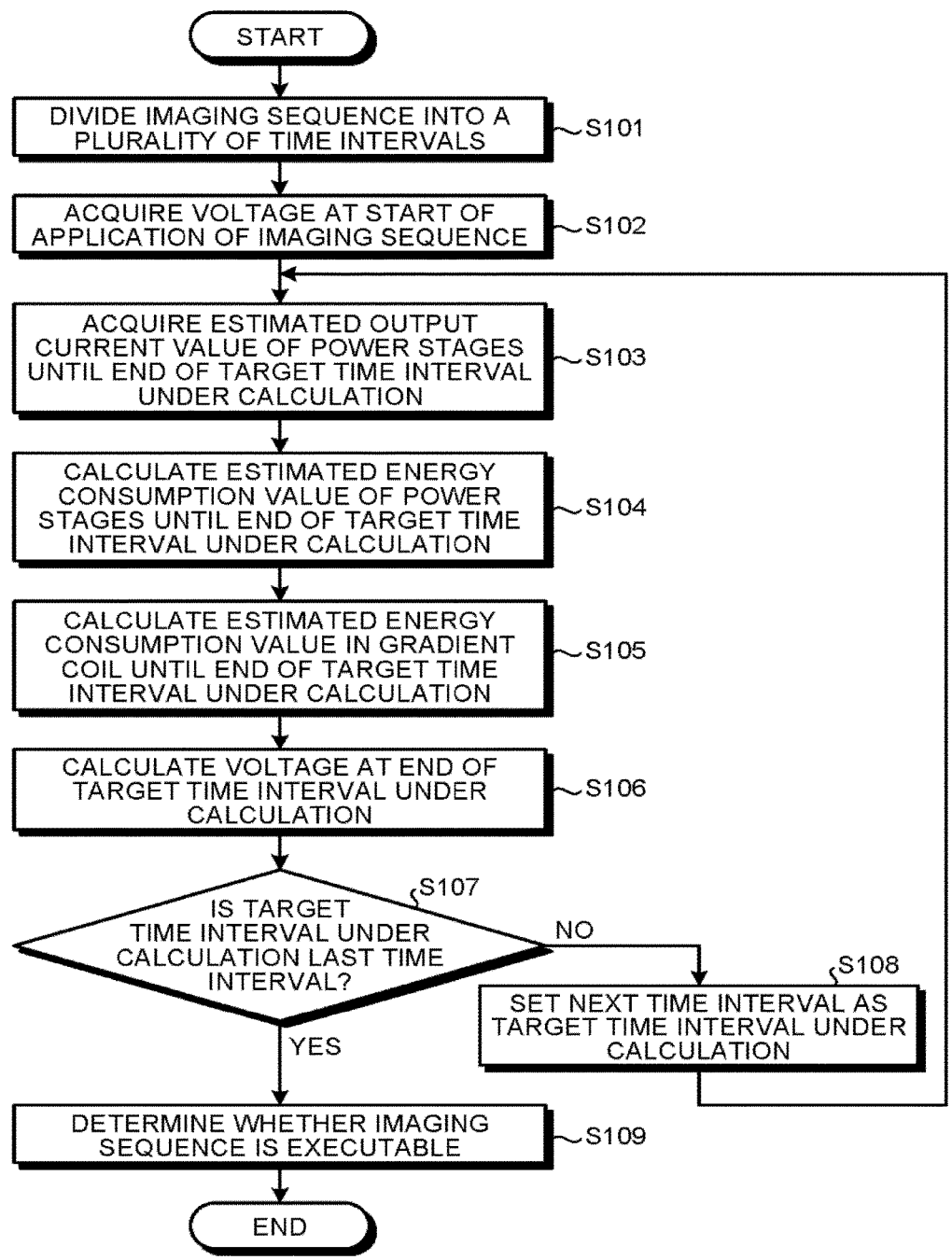
FIG. 3 is a flowchart illustrating the procedure of processing performed by the magnetic resonance imaging apparatus according to the first embodiment.

The magnetic resonance imaging apparatus 100 according to the first embodiment is configured based on those backgrounds. The processing performed by the magnetic resonance imaging apparatus 100 according to the first embodiment will be described using FIG. 3 and FIG. 6 and, if necessary, with reference to FIG. 4, FIG. 5A, FIG. 5B, FIG. 5C, FIG. 7, and FIG. 8. FIG. 3 and FIG. 6 are flowcharts illustrating the procedure of the processing performed by the magnetic resonance imaging apparatus 100 according to the first embodiment. FIG. 3 is a flowchart illustrating the procedure of the overall processing. FIG. 6 is a flowchart illustrating step S105 in FIG. 3 in details. FIG. 4, FIG. 5A, FIG. 5B, FIG. 5C, FIG. 7, and FIG. 8 are diagrams for explaining the processing performed by the magnetic resonance imaging apparatus 100 according to the first embodiment.

The processing circuit 150 in the magnetic resonance imaging apparatus 100 according to the first embodiment allows the determination function 11 to divide an imaging sequence, which is to be determined as to whether the imaging sequence is executable, into a plurality of time intervals (step S101). This will be described with reference to FIG. 4.

Figure 4:
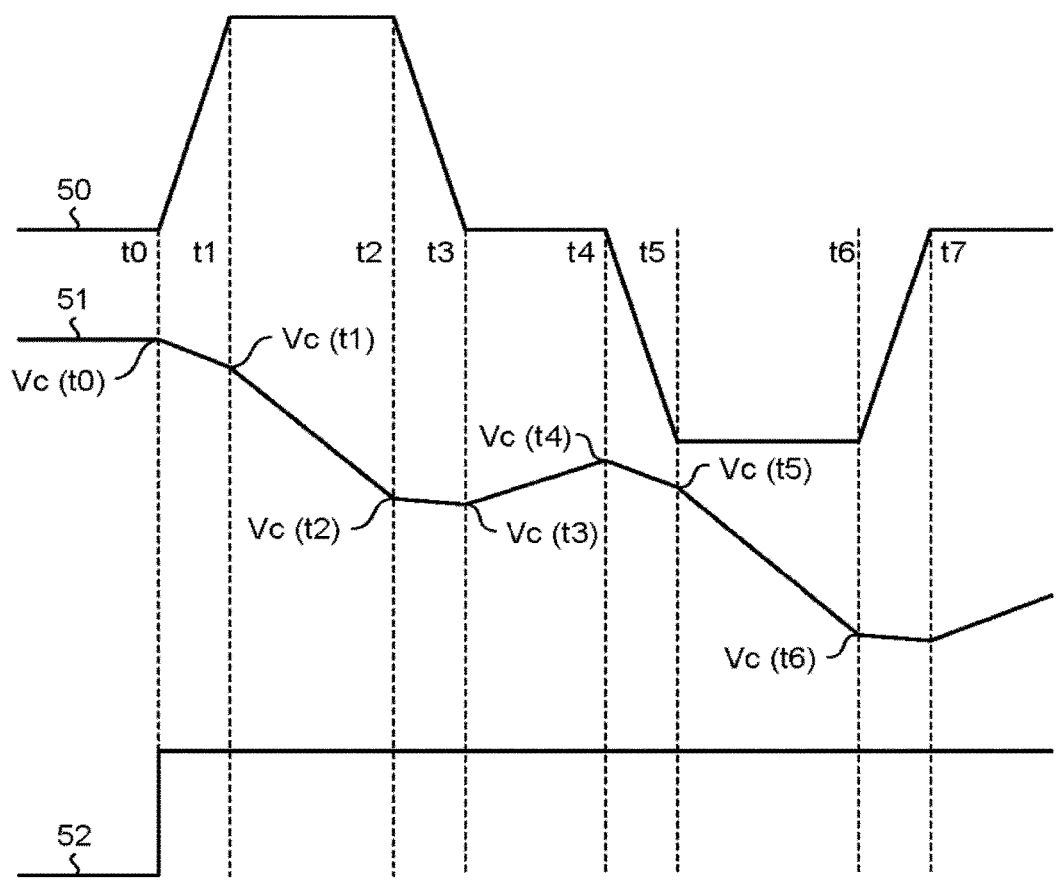
FIG. 4 is a diagram for explaining the processing performed by the magnetic resonance imaging apparatus according to the first embodiment.

As previously mentioned, the voltage $Vc(t)$ of the capacitor banks $21x$ to $21z$ can be calculated by forming a set of Equation (1) and Equations (2) to (5). Since the waveform of a gradient magnetic field is not always differentiable in the entire time interval as previously mentioned, it is reasonable to divide the imaging sequence into a plurality of time intervals. FIG. 4 depicts such a situation.

The top line in FIG. 4 represents a waveform 50 of the gradient magnetic field. More specifically, the waveform 50 corresponds to a temporal change in magnitude of the gradient magnetic field applied using the gradient coil 102. Given that the waveform 50 is roughly similar to the current $I(t)$ flowing through the gradient coil 102, the waveform 50 also represents the waveform of the current $I(t)$ flowing through the gradient coil 102. The differential coefficient (temporal change in magnitude of the applied gradient magnetic field) of the waveform 50 discontinuously changes at or near time $t_0$, $t_1$, $t_2$, $t_3$, $t_4$, $t_5$, $t_6$, and $t_7$. The processing circuit 150 divides, by the determination function 11, the time in which the imaging sequence is executed into a plurality of time intervals having boundaries at points where the temporal change in magnitude of the applied gradient magnetic field is discontinuous. In other words, the processing circuit 150 divides, by the determination function 11, the time in which the imaging sequence is executed into a plurality of time intervals in accordance with the temporal change of magnitude of the applied gradient magnetic field. In dividing the time in which the imaging sequence is executed into a plurality of time intervals, the points of division between the time intervals are chosen as, for example, the time intervals in which the imaging sequence increases (the gradient magnetic field increases) and the time intervals in which the imaging sequence decreases (the gradient magnetic field decreases) as well as the times on both ends of the time intervals in which the imaging sequence is constant (the gradient magnetic field is constant). For example, the processing circuit 150 divides the time interval from the imaging sequence start time ($t_0$) to the imaging sequence end time ($t_7$), into a plurality of time intervals, namely, $t_0$ to $t_1$, $t_1$ to $t_2$, $t_2$ to $t_3$, $t_3$ to $t_4$, $t_4$ to $t_5$, $t_5$ to $t_6$, and $t_6$ to $t_7$.

Afterwards, the processing circuit 150 allows the determination function 11 to perform processing for each of the plurality of divided time intervals. For example, the processing circuit 150 allows the determination function 11 to initially set $t_0$ to $t_1$ as the target time interval under calculation. After completion of the processing in the time interval $t_0$ to $t_1$, the processing circuit 150 allows the determination function 11 to set $t_1$ to $t_2$ as the target time interval under calculation. After completion of the processing in the time interval $t_1$ to $t_2$, the processing circuit 150 allows the determination function 11 to set $t_2$ to $t_3$ as the target time interval under calculation. The same processing is subsequently performed. Upon completion of the processing in the time interval $t_6$ to $t_7$, the processing circuit 150 terminates the series of processing.

A graph 51 in FIG. 4 illustrates a temporal change of the voltage $Vc(t)$ of the capacitor banks $21x$ to $21z$, which is calculated by the processing circuit 150 through the processing performed by the determination function 11. A graph 52 in FIG. 4 illustrates a temporal change of the voltage $Ip(t)$ supplied by the post regulator 20.

The processing circuit 150 then allows the determination function 11 to acquire the value of the voltage of the capacitor banks $21x$ to $21z$ at the start of application of the imaging sequence (step S102). The value of this voltage is, for example, an initial value set as a default value of the voltage of the capacitor banks $21x$ to $21z$.

The processing circuit 150 then allows the determination function 11 to acquire the estimated output current value of the power stages $22x$ to $22z$ in the target time interval under calculation (step S103). Given that the estimated output current value of the power stages $22x$ to $22z$ is similar to the waveform of the gradient magnetic field, acquiring the estimated output current value of the power stages $22x$ to $22z$ is equivalent to acquiring the waveform of the gradient magnetic field from the start to the end of the target time interval under calculation. The processing circuit 150 acquires the estimated output current value of the power stages 22x to 22z from the storage circuit 123 or through the user's input through the input device 124.

Figure 5A:
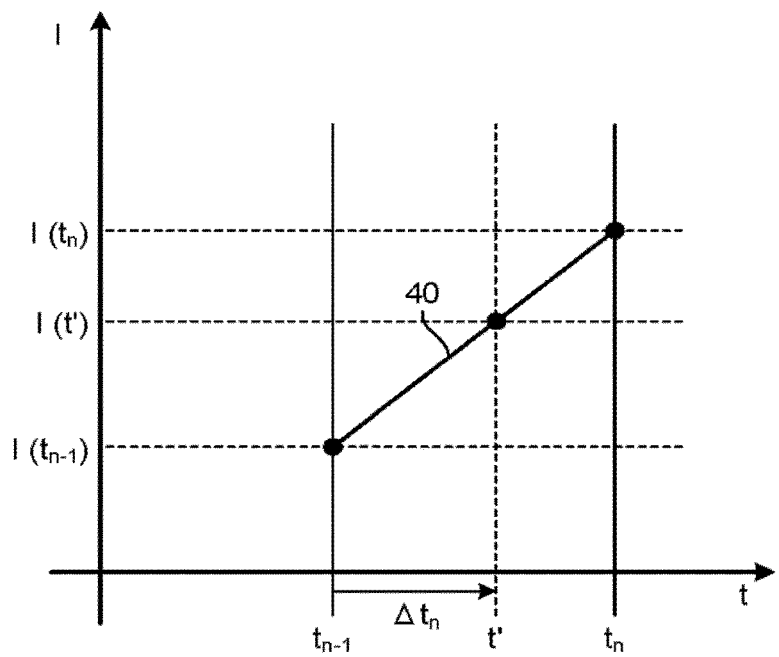
FIG. 5A, FIG. 5B, and FIG. 5C are diagrams for explaining the processing performed by the magnetic resonance imaging apparatus according to the first embodiment.
Figure 5B:
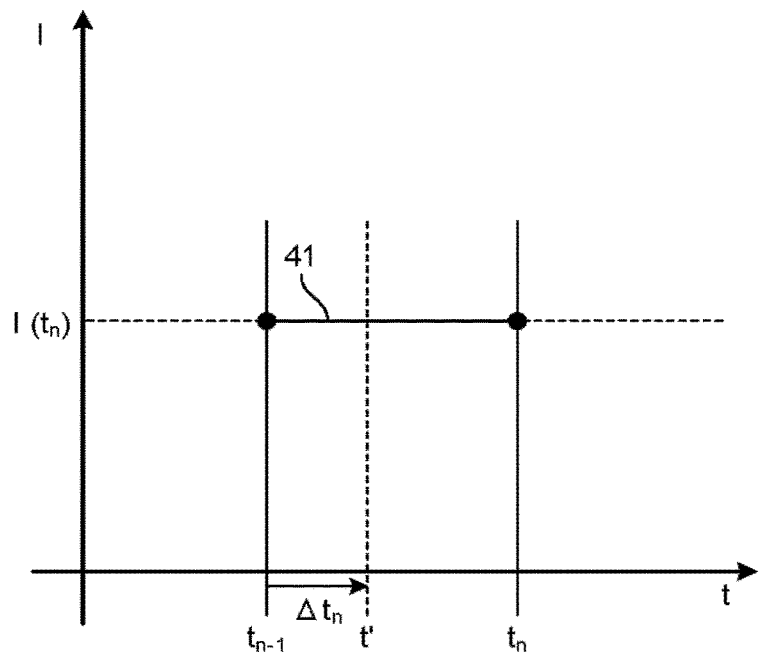
Figure 5C:
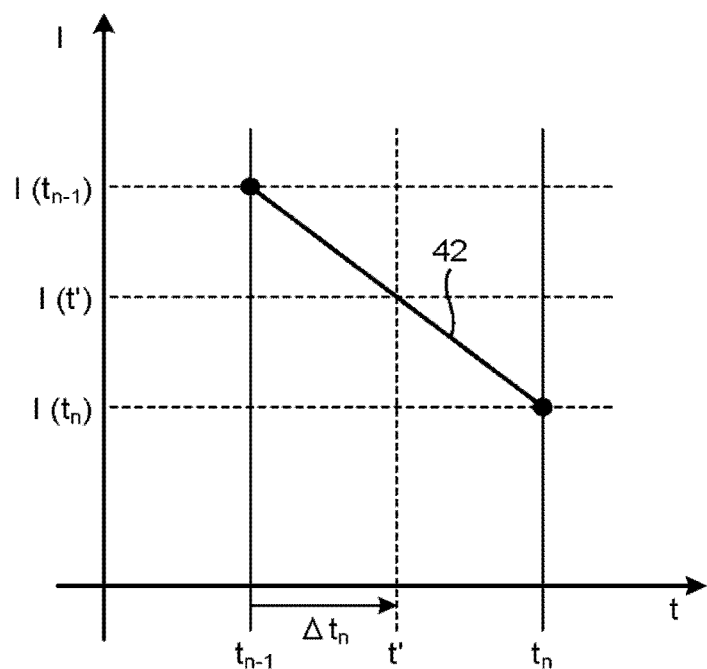
Figure 6:
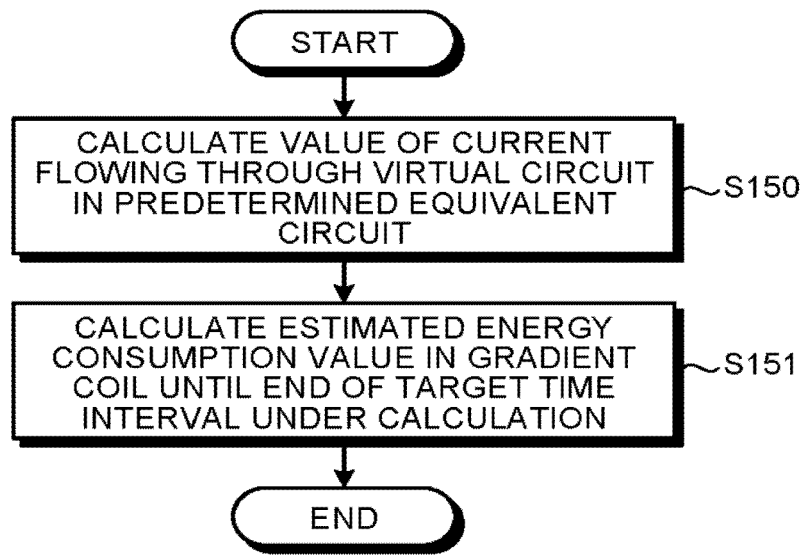
FIG. 6 is a flowchart illustrating the procedure of processing performed by the magnetic resonance imaging apparatus according to the first embodiment.

FIG. 5A to FIG. 5C illustrate specific examples of the estimated output current value of the power stages 22x to 22z acquired by the processing circuit 150 through the determination function 11.

A straight line 40 in FIG. 5A is a plot of the estimated output current value as a function of time t in a case where the estimated output current value I(t) at time t increases in the form of a linear function. The estimated output current value is $I(t_{n-1})$ at $t=t_{n-1}$, $I(t_n)$ at $t=t_n$, and I(t') at $t=t'=t_{n-1}+\Delta t_n$. In this case, Equation (6) holds:

$$I(t')=I(t_{n-1})+SR\times\Delta t_n \quad (6)$$

where SR is a slew rate, which is a parameter representing the rate of the increase of the gradient magnetic field.

A straight line 41 in FIG. 5B is a plot of the estimated output current value as a function of time t in a case where the estimated output current value I(t) at a time t is flat (constant). The estimated output current value is a constant value $I(t_n)$ for any t=t' where $t_{n-1}\leq t'\leq t_n$. In this case, Equation (7) holds.

$$I(t')=I(t_n) \quad (7)$$

A straight line 42 in FIG. 5C is a plot of the estimated output current value as a function of time t in a case where the estimated output current value I(t) at a time t decreases in the form of a linear function. The estimated output current value is $I(t_{n-1})$ at $t=t_{n-1}$, $I(t_n)$ at $t=t_n$, and I(t') at $t=t'=t_{n-1}+\Delta t_n$. In this case, Equation (6) holds, as in the case in FIG. 5A. In this case, however, the coefficient SR is negative.

The processing circuit 150 then allows the determination function 11 to acquire the estimated consumption energy value $E_a$ (energy consumption value) of the power stages 22x to 22z from the start to the end of the target time interval under calculation (step S104). The formula of the estimated consumption energy value $E_a$ of the power stages 22x to 22z can be expressed by Equation (8).

$$E_a=\int_{t_{n-1}}^{t_{n-1}+\Delta t}(\alpha I(t')^2+\beta I(t')+\gamma)dt' \quad (8)$$

Here, the functional form of the estimated output current value I(t') at time t' is known at step S103. The processing circuit 150 therefore allows the determination function 11 to substitute the value acquired at step S103 in the formula of the estimated output current value I(t') in Equation (8) and perform integration to calculate the estimated consumption energy value $E_a$ in the power stages 22x to 22z.

For example, in the case where the estimated output current value I(t') is given by Equation (6) (that is, when the output current I(t') increases or decreases in the form of a linear function), the processing circuit 150, performing the integration in Equation (8), allows the determination function 11 to calculate the consumption energy $E_a$ in the power stages 22x to 22z as illustrated by Equation (9).

$$E_a = \frac{\alpha}{3}SR^2(\Delta t)^3 + \frac{\beta}{2}SR(\Delta t)^2 + \\ \alpha SRI(t_{n-1})(\Delta t)^2 + (\alpha I(t_{n-1})^2 + \beta I(t_{n-1}) + \gamma)(\Delta t) \quad (9)$$

In the case where the estimated output current value I(t') is given by Equation (7) (that is, when the output current I(t') is constant), the processing circuit 150, performing the integration in Equation (8), allows the determination function 11 to calculate the consumption energy $E_a$ in the power stages 22x to 22z as illustrated by Equation (10).

$$E_a=(\alpha I(t_n)^2+\beta I(t_n)+\gamma)(\Delta t) \quad (10)$$

In the case where the output current I(t') has any other functional form, the processing circuit 150 allows the determination function 11 to calculate the consumption energy $E_a$ in the power stages 22x to 22z as well by substituting the formula of the output current I(t') in Equation (8) and performing integration.

The processing circuit 150 then calculates the estimated consumption energy value $E_g$ in the gradient coil 102 in the target time interval under calculation (step S105).

As previously mentioned, the actual gradient coil 102 has complicated electrical and magnetic properties, for example, due to skin effect and eddy currents. In order to fully replicate these characteristics, the processing circuit 150 in the magnetic resonance imaging apparatus 100 according to the first embodiment allows the determination function 11 to calculate the estimated consumption energy value $E_g$ in the gradient coil 102 using a predetermined equivalent circuit.

The details of the processing at step S104 are illustrated in the flowchart in FIG. 6. FIG. 6 illustrates the steps in the processing at step S104 in FIG. 3 in details. Specifically, step S104 in FIG. 3 includes step S150 and step S151 in FIG. 6.

The processing circuit 150 allows the determination function 11 to calculate the value of current flowing through a virtual circuit in a predetermined equivalent circuit (step S150). This processing will be described with reference to FIG. 7.

Figure 7:
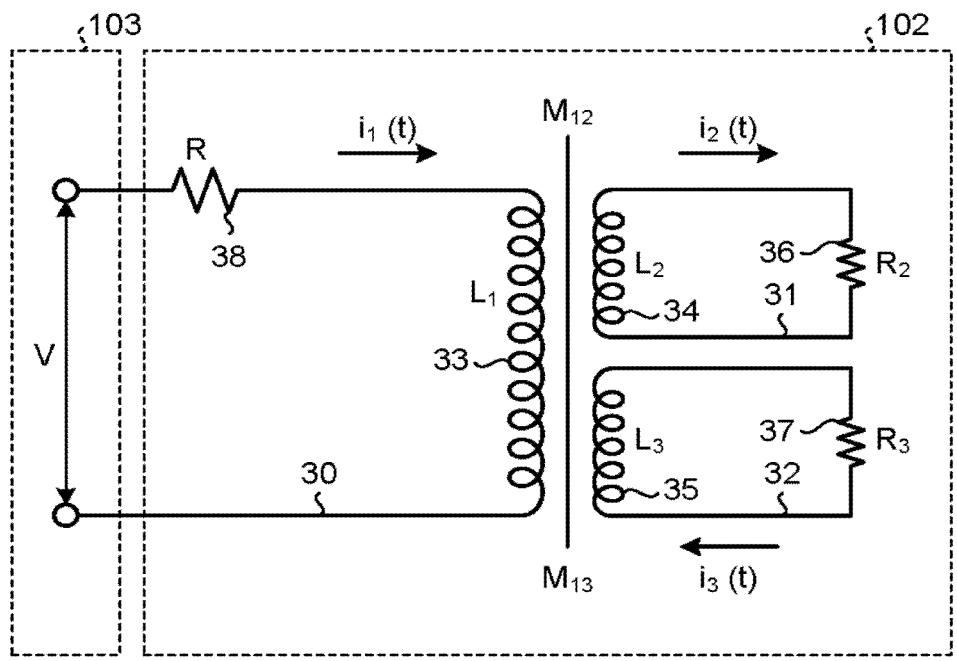
FIG. 7 is a diagram for explaining the processing performed by the magnetic resonance imaging apparatus according to the first embodiment.

The circuit illustrated in FIG. 7 is an example of the equivalent circuit that replicates the electrical properties of the gradient coil 102 to which the gradient power supply 103 applies voltage. The equivalent circuit including the gradient coil 102 includes, for example, a first circuit 30 and a second circuit that includes a closed circuit 31 and a closed circuit 32.

The first circuit 30 includes a resistor 38 connected to the gradient power supply 103 and having a resistance value R, and a coil 33 having a self-inductance $L_1$. The closed circuit 31 includes a resistor 36 having a resistance value $R_2$, and a coil 34 having a self-inductance $L_2$. The closed circuit 32 includes a resistor 37 having a resistance value $R_3$, and a coil 35 having a self-inductance $L_3$. A mutual inductance $M_{12}$ is present between the coil 33 and the coil 34. A mutual inductance $M_{13}$ is present between the coil 33 and the coil 35.

The circuit equations for the closed circuit 31 and the closed circuit 32 are written as Equations (11) below:

$$\left. \begin{array}{l} L_2\dfrac{di_2(t)}{dt} + R_2i_2(t) = M_{12}\dfrac{di_1(t)}{dt} \\ L_3\dfrac{di_3(t)}{dt} + R_3i_3(t) = M_{13}\dfrac{di_1(t)}{dt} \end{array} \right\} \quad (11)$$

where t is time; $i_1(t)$ is a current flowing through the first circuit 30; $i_2(t)$ is a current flowing through the closed circuit 31; and $i_3(t)$ is a current flowing through the closed circuit 32.

The effect given by the closed circuit 31 and the closed circuit 32 on the first circuit 30 through the mutual inductance is the effect of high-order perturbation for the current $i_1(t)$ flowing through the first circuit 30 and is thus generally small and, for example, can be omitted.

The current $i_1(t)$ is the variable corresponding to the waveform of the pulse sequence of the gradient magnetic field. That is, the changing waveform of the pulse sequence is concomitant to the temporal change of the current $i_1(t)$.

The current $i_1(t)$ is the variable also corresponding to the estimated output current value I(t) of the power stages 22x to 22z in the target time interval under calculation that is acquired by the processing circuit 150 by the determination function 11 at step S103.

The processing circuit 150 then allows the determination function 11 to calculate the values of the currents ($i_2(t)$ and $i_3(t)$) flowing through the closed circuit 31 and the closed circuit 32, based on the information of the imaging sequence.

An example of the method is a predetermined method using the Laplace transform. Alternatively, the general solution of the differential equation may be obtained by separation of variables and thereafter the particular solution may be obtained by the variation of the variables. Equations (11) are first-order linear differential equations with respect to time t and thus can be solved for the function of any given current $i_1(t)$, and therefore the current $i_2(t)$ and the current $i_3(t)$ can be expressed as a function of the current $i_1(t)$.

For example, when the current $i_1(t)$ has a value $i_0$ at time t=0 and the current value increases (or decreases) at a constant rate SR, the current $i_1(t)$ is expressed by Equation (12) below.

$$i_1(t) = SR \times t + i_0 \qquad (12)$$

In this case, the differential equation is solved, and then the current $i_2(t)$ and the current $i_3(t)$ are expressed by Equations (13) below.

$$i_2(t) = \frac{SR \times M_{12}}{R_2}\left(1 - e^{-\frac{R_2}{L_2}t}\right) + i_2(0)e^{-\frac{R_2}{L_2}t} \qquad (13)$$
$$i_3(t) = \frac{SR \times M_{13}}{R_3}\left(1 - e^{-\frac{R_3}{L_3}t}\right) + i_3(0)e^{-\frac{R_3}{L_3}t}$$

The processing circuit 150 thus can calculate the values of the currents flowing through the closed circuit 31 and the closed circuit 32, using Equations (13).

As another example, when the current $i_1(t)$ has a constant value $i_0$, the current $i_1(t)$ is expressed by Equation (14) below.

$$i_1(t) = i_0 \qquad (14)$$

In this case, the differential equation is solved, and then the current $i_2(t)$ and the current $i_3(t)$ are represented by Equations (15) below.

$$i_2(t) = i_2(0)e^{-\frac{R_2}{L_2}t} \qquad (15)$$
$$i_3(t) = i_3(0)e^{-\frac{R_3}{L_3}t}$$

The processing circuit 150 thus can calculate the values of the currents flowing through the closed circuit 31 and the closed circuit 32, using Equations (13).

To summarize, the processing circuit 150 allows the determination function 11 to use, as an equivalent circuit for the circuit including the gradient coil 102, the first circuit 30 connected to the gradient power supply 103 and having self-inductance $L_1$, and the second circuit including the closed circuits 31 and 32 having mutual inductance with the first circuit 30. The processing circuit 150 allows the determination function 11 to calculate the values of the currents $i_2(t)$ and $i_3(t)$ flowing through the closed circuits 31 and 32, based on the imaging sequence to be executed in magnetic resonance imaging. That is, the processing circuit 150 allows the determination function 11 to solve the differential equation derived through the equivalent circuit for each of the plurality of time intervals.

Figure 8:
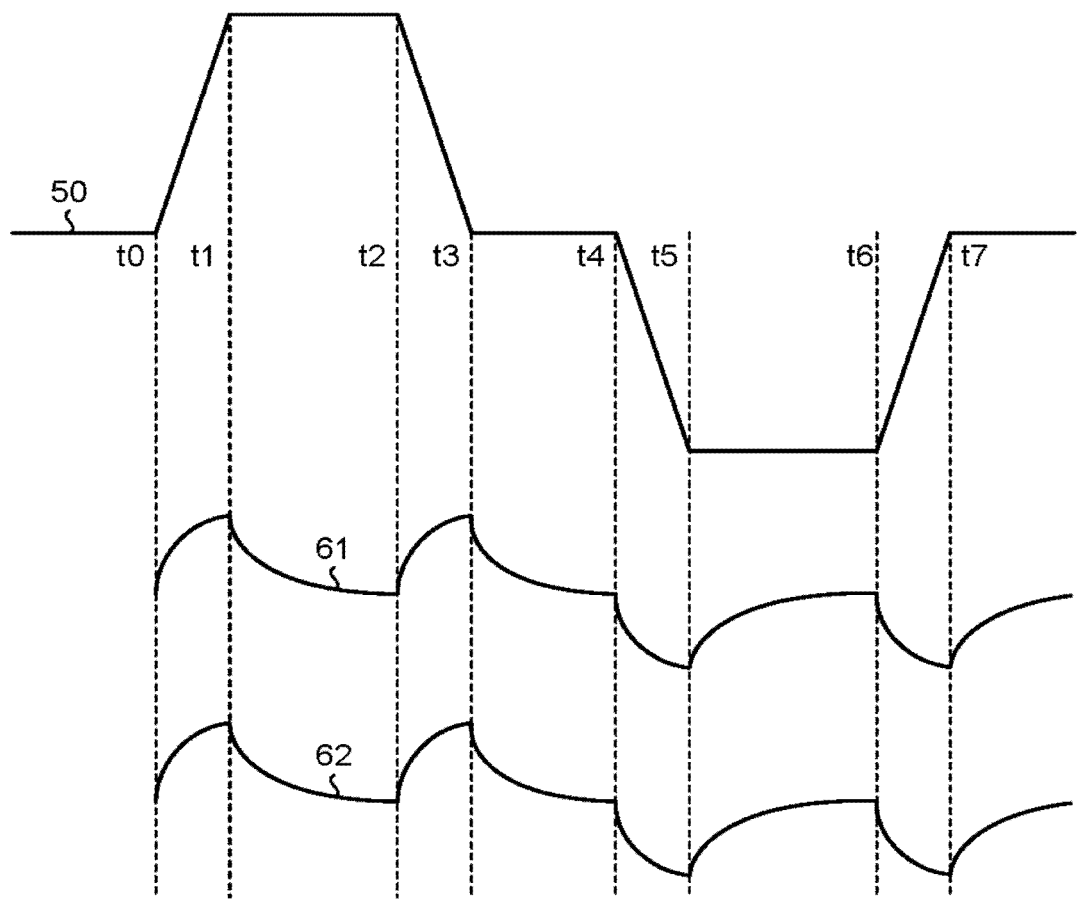
FIG. 8 is a diagram for explaining the processing performed by the magnetic resonance imaging apparatus according to the first embodiment.

FIG. 8 illustrates a specific example of the waveforms of the currents flowing through the closed circuits 31 and 32. The waveform 50 is the waveform of the estimated output current value I(t) of the power stages 22x to 22z. The waveform 50 corresponds to the waveform of the current $i_1(t)$ flowing through the first circuit 30. Here, a waveform 61 is a specific example of the waveform of the current flowing through the closed circuit 31, and a waveform 62 is a specific example of the waveform of the current flowing through the closed circuit 32.

Returning to FIG. 6, the processing circuit 150 allows the determination function 11 to calculate the total estimated consumption energy value (energy consumption value) of the gradient coil until the end of the target time interval under calculation (step S151). Specifically, the processing circuit 150 allows the determination function 11 to calculate the magnitude of Joule heat consumed in the equivalent circuit at each time, as the estimated value of the consumption energy in the gradient coil 102. Here, energy is consumed in the resistor 38 in the first circuit 30, the resistor 36 in the closed circuit 31, and the resistor 37 in the closed circuit 32. Typically, the size of the resistor 38 is often designed to be small. The processing circuit 150 therefore, for example, mainly focuses on the consumption energy $E_2(t)$ in the closed circuit 31 and the consumption energy $E_3(t)$ in the closed circuit 32 to calculate the estimated value of the consumption energy $E_g(t)$ in the gradient coil 102 at each time, as illustrated by Equation (16).

$$E_g = E_2 + E_3 = \int_0^{\Delta t} R_2 i_2(t)^2\, dt + \int_0^{\Delta t} R_3 i_3(t)^2\, dt \qquad (16)$$

When the current $i_1(t)$ flowing through the first circuit 30 is expressed by Equation (12), the processing circuit 150 substitutes Equations (13) in Equation (16) to calculate the estimated value of the consumption energy $E_g(t)$ in the gradient coil 102 at each time, for example, as illustrated by Equations (17).

$$E_2 = \left(\frac{SR \times M_{12}}{R_2}\right)^2 \left\{R_2 \Delta t - 2L_2\left(1 - e^{-\frac{R_2}{L_2}\Delta t}\right) + \frac{L_2}{2}\left(1 - e^{-\frac{2R_2}{L_2}\Delta t}\right)\right\} + \qquad (17)$$
$$\frac{SR \times M_{12} L_2 i_2(0)}{R_2}\left(1 - e^{-\frac{R_2}{L_2}\Delta t}\right)^2 + \frac{L_2 i_2(0)^2}{2}\left(1 - e^{-\frac{2R_2}{L_2}\Delta t}\right)$$
$$E_3 = \left(\frac{SR \times M_{13}}{R_3}\right)^2 \left\{R_3 \Delta t - 2L_3\left(1 - e^{-\frac{R_3}{L_3}\Delta t}\right) + \frac{L_3}{2}\left(1 - e^{-\frac{2R_3}{L_3}\Delta t}\right)\right\} + $$
$$\frac{SR \times M_{13} L_3 i_3(0)}{R_3}\left(1 - e^{-\frac{R_3}{L_3}\Delta t}\right)^2 + \frac{L_3 i_3(0)^2}{2}\left(1 - e^{-\frac{2R_3}{L_3}\Delta t}\right)$$

When the current $i_1(t)$ flowing through the first circuit 30 is expressed by Equation (14), the processing circuit 150 substitutes Equations (15) in Equation (16) to calculate the estimated value of the consumption energy $E_g(t)$ in the gradient coil 102 at each time, for example, as illustrated by Equations (18)

$$E_2 = \frac{L_2 i_2(0)^2}{2}\left(1 - e^{-\frac{2R_2}{L_2}\Delta t}\right) \quad (18)$$

$$E_3 = \frac{L_3 i_3(0)^2}{2}\left(1 - e^{-\frac{2R_3}{L_3}\Delta t}\right)$$

That is, the processing circuit 150 allows the determination function 11 to calculate the estimated value of the energy consumed in the gradient coil 102, based on the values of currents flowing through the closed circuits 31 and 32.

The circuit configuration of the equivalent circuit is given only by way of illustration, and embodiments are not limited to the example described above. For example, the number of closed circuits is not limited to two but may be, for example, one or three. The processing circuit 150 may use a circuit including capacitors as the equivalent circuit in order to incorporate effects such as dielectric loss. In the example described above, the processing circuit 150 uses the equations for the closed circuits alone. However, the processing circuit 150 may use an equation for the first circuit.

The processing circuit 150 may allow the determination function 11 to calculate, for example, the estimated value of the voltage applied to the gradient coil 102, the estimated value of the current, and/or the current-voltage characteristic of the gradient coil 102, based on the values of the currents flowing through the closed circuits.

Returning to FIG. 3, the processing circuit 150 allows the determination function 11 to calculate the voltage of the capacitor banks 21x to 21z at the time when the target time interval under calculation is finished (step S106).

A method of calculating the voltage of the capacitor banks 21x to 21z will be described briefly. First of all, Equation (19) below, similar to Equation (1), holds:

$$E_a + E_g = E_c + E_p \quad (19)$$

where $E_a$ is the energy consumed in the power stages 22x to 22z in one of the divided time intervals; $E_g$ is the energy consumed in the gradient coil 102 in one of the divided time intervals; $E_c$ is the energy supplied from the capacitor banks 21x to 21z to the gradient coil 102 in one of the divided time intervals; and $E_a^{total}$ is the energy supplied from the post regulator 20 in one of the divided time intervals.

Next, the integration for Ep on the right side of Equation (19) can be approximated as Equation (20) below by performing discretization:

$$E_p = \int_{t_{n-1}}^{t_n} V_c(t) \cdot I_p(t) dt \quad (20)$$

$$\approx \frac{V_c(t_n) + V_c(t_{n-1})}{2} \cdot I_p(t_n) \cdot \Delta t$$

where n is the number of each of the time intervals divided by the processing circuit 150 through the determination function 11; $t_n$ is the largest time in the (n−1)th time interval; and $t_{n-1}$ is the smallest time in the (n−1)th time interval. In other words, the n-th time interval is $t_n$ to $t_{n+1}$. That is, the first time interval is $t_0$ to $t_1$, the second time interval is $t_1$ to $t_2$, and the same applies to the subsequent time intervals. Furthermore, $\Delta t$ is a value defined by Equation (21) below.

$$\Delta t = t_n - t_{n-1} \quad (21)$$

The right side Ec of Equation (19) is expressed by Equation (22) below.

$$E_c = \frac{1}{2} C \cdot V_c(t_{n-1})^2 - \frac{1}{2} C \cdot V_c(t_n)^2 \quad (22)$$

Equation (20) and Equation (22) are substituted in Equation (19) to yield Equation (23) below.

$$E_a + E_g = \frac{1}{2} C \cdot V_c(t_{n-1})^2 - \frac{1}{2} C \cdot V_c(t_n)^2 + \frac{V_c(t_n) + V_c(t_{n-1})}{2} \cdot I_p(t_n) \Delta t \quad (23)$$

Equation (23) is a quadratic equation with respect to $V_c(t_n)$ and solved with respect to $V_c(t_n)$ to yield Equation (24) below.

$$V_c(t_n) = \quad (24)$$

$$\frac{1}{2}\left[\frac{I_p(t_n)\Delta t}{C} + \sqrt{\left(\frac{I_p(t_n)\Delta t}{C}\right)^2 - 4\left(\frac{I_p(t_n)\Delta t}{C}V_c(t_{n-1}) - V_c(t_{n-1})^2 + \frac{2}{C}(E_a + E_g)\right)}\right]$$

In other words, the processing circuit 150 allows the determination function 11 to calculate the relational expression to be satisfied at the times on both ends for each of the plurality of time intervals and calculates the estimated value of the voltage of the capacitor banks 21x to 21z based on the calculated relational expression. In this manner, the processing circuit 150 allows the determination function 11 to calculate the voltage value $V_c(t_n)$ of the capacitor banks 21x to 21z at t=$t_n$, based on the voltage value $V_c(t_{n-1})$ of the capacitor banks 21x to 21z at t=$t_{n-1}$, based on Equation (24).

When the processing circuit 150 allows the determination function 11 to calculate the voltage value $V_c(t_n)$ of the capacitor banks 21x to 21z at t=$t_n$, based on the voltage value $V_c(t_{n-1})$ of the capacitor banks 21x to 21z at t=$t_{n-1}$, the processing circuit 150 allows the determination function 11 to determine whether the target time interval $t_{n-1}$ to $t_n$ under calculation is the last time interval. If the processing circuit 150 determines through the determination function 11 that the target time interval $t_{n-1}$ to $t_n$ under calculation is not the last time interval (No at step S107), the processing circuit 150 allows the determination function 11 to set the next time interval $t_n$ to $t_{n+1}$ as the target time interval under calculation (step S108). The processing subsequent to step S103 is then repeated.

If the processing circuit 150 determines through the determination function 11 that the target time interval $t_{n-1}$ to $t_n$ under calculation is the last time interval (Yes at step S107), the calculation has been performed up to the last time interval. The calculation is thus terminated.

The processing circuit 150 then allows the determination function 11 to determine whether it is acceptable to execute the imaging sequence (whether the image sequence is executable), based on the values of the currents $i_2(t)$ and $i_3(t)$ flowing through the closed circuits 31 and 32, prior to the execution of the imaging sequence (step S109). Specifically, the processing circuit 150 allows the determination function 11 to calculate the estimated value of the voltage of the capacitor banks for supplying current to the gradient coil 102, based on the current values, and to determine whether it is acceptable to execute the imaging sequence, based on the calculated estimated voltage value, prior to the execution of the sequence.

When the processing circuit 150 determines through the determination function 11 that it is acceptable to execute the imaging sequence, the sequence control circuit 110 executes the imaging sequence. If the processing circuit 150 determines through the determination function 11 that it is not acceptable to execute the imaging sequence, the sequence control circuit 110 may accept re-setting of the imaging conditions from the user through the input device 124.

As a criterion for determining whether it is acceptable to execute the imaging sequence, for example, if the calculated voltage value of the capacitor banks 21x to 21z exceeds a predetermined value, the processing circuit 150 may determine through the determination function 11 that it is acceptable to execute the imaging sequence. If the calculated voltage value becomes lower than the predetermined value, it may be determined that it is not acceptable to execute the imaging sequence. As another criterion for determining whether it is acceptable to execute the imaging sequence, for example, if the calculated values of the currents flowing through the closed circuits 31 and 32 become lower than a predetermined value, the processing circuit 150 may determine through the determination function 11 that it is acceptable to execute the imaging sequence. If the calculated values of the currents exceed the predetermined value, it may be determined that it is not acceptable to execute the imaging sequence.

In the example in the embodiment described above, the post regulator 20 operates such that the value of the supplied current retains a predetermined value. However, embodiments are not limited to this example. For example, the post regulator 20 may operate such that the value of the supplied voltage retains a predetermined value.

In the example in the embodiment described above, the energy consumed in the power stages 22x, 22y, and 22z is a quadratic function of the output current. However, embodiments are not limited to this example. For example, consumption energy in the power stages 22x, 22y, and 22z may be calculated, for example, using the actually measured value of the voltage-current characteristic.

As described above, the processing circuit 150 in the magnetic resonance imaging apparatus 100 according to the first embodiment focuses on the value of the current flowing through the mutual induction coil having mutual inductance with the coil connected to the gradient power supply 103, which is an equivalent circuit for the gradient coil 102 connected to the gradient power supply 103, and calculates the value of the current. The processing circuit 150 then calculates the consumption energy in the gradient coil 102 from the obtained current value and calculates the voltage of the capacitor banks 21x to 21z based on the calculated consumption energy. The magnetic resonance imaging apparatus 100 according to the first embodiment thus can predict an electrical load on the gradient magnetic field generating system. More specifically, the magnetic resonance imaging apparatus 100 according to the first embodiment can use the equivalent circuit according to the first embodiment to accurately estimate the voltage of the capacitor banks 21x to 21z with less computational load. Consequently, the magnetic resonance imaging apparatus 100 according to the first embodiment can execute the imaging sequence under an optimized condition.

Second Embodiment

In the first embodiment, the processing circuit 150 allows the determination function 11 to determine whether an imaging sequence is executable, based on the estimated value of the voltage of the capacitor banks 21x to 21z. The magnetic resonance imaging apparatus 100 according to a second embodiment controls imaging conditions based on the calculated, estimated value of the voltage of the capacitor banks 21x to 21z.

Figure 9A:
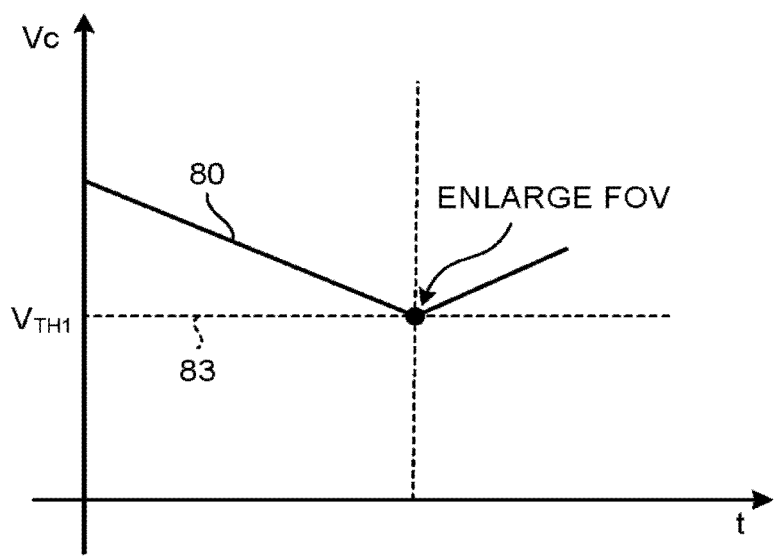
FIG. 9A, FIG. 9B, and FIG. 9C are diagrams for explaining the processing performed by the magnetic resonance imaging apparatus according to a second embodiment.
Figure 9B:
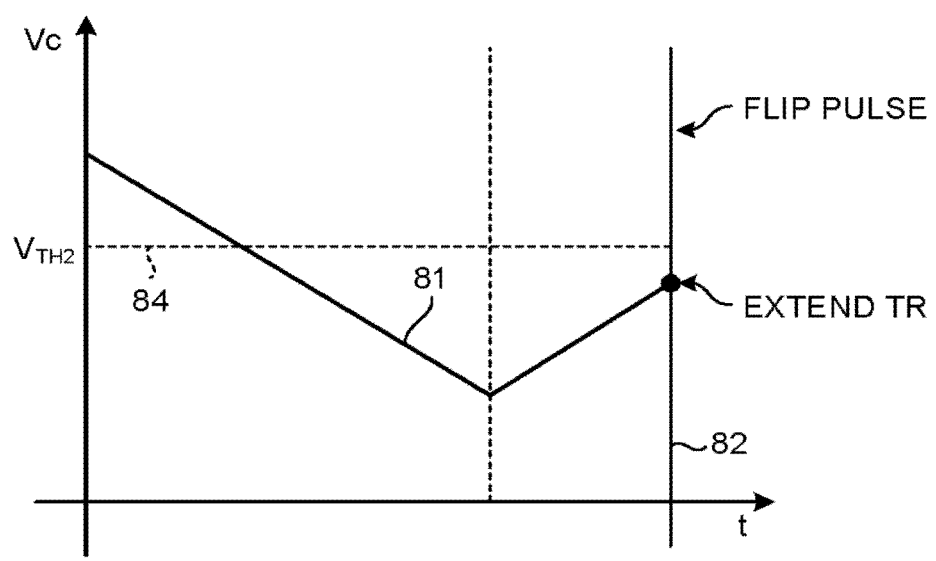
Figure 9C:
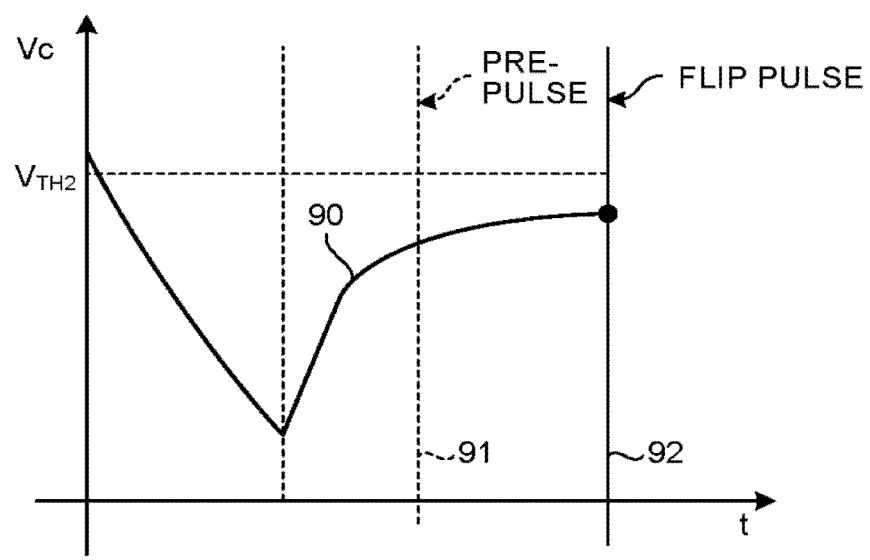

FIG. 9A, FIG. 9B, and FIG. 9C are diagrams for explaining the processing performed by the magnetic resonance imaging apparatus 100 according to the second embodiment. A graph 80 in FIG. 9A represents a temporal change of the estimated value of the voltage of the capacitor banks 21x to 21z. When the estimated value of the voltage of the capacitor banks 21x to 21z becomes lower than a predetermined threshold 83 ($V_{TH1}$), the sequence control circuit 110 reduces the image resolution and executes the imaging sequence. The image resolution is, for example, a resolution in the slice direction, a resolution in the read-out direction, and a resolution in the phase encoding direction.

In order to reduce the resolution in the slice direction, for example, the slice thickness is increased. In order to reduce the resolutions in the read out direction and the phase encoding direction, for example, the number of matrices of the image is reduced. Alternatively, the field of view (FOV) in imaging may be enlarged. The size of the FOV in imaging is associated with the gradient of the gradient magnetic field. That is, the larger the size of the FOV in imaging, the smaller the gradient of the gradient magnetic field. This processing can forestall a drop in the voltage value of the capacitor banks 21x to 21z.

A graph 81 in FIG. 9B also illustrates a temporal change of the estimated value of the voltage of the capacitor banks 21x to 21z. The graph 81 illustrates a case in which the voltage of the capacitor banks 21x to 21z decreases due to the execution of the imaging sequence and the voltage thereafter gradually recovers. When the estimated value of the voltage of the capacitor banks 21x to 21z at a predetermined time does not recover to a specified threshold 84 ($V_{TH2}$) at time 82 when the flip pulse is applied, the sequence control circuit 110 prolongs the repetition time (TR) to execute the imaging sequence.

When the estimated value of the voltage of the capacitor banks 21x to 21z does not recover to the specified threshold 84 at time 82 when the flip pulse is applied, the repetition time may be too short. The sequence control circuit 110 therefore prolongs the repetition time to execute the imaging sequence. With this processing, the voltage of the capacitor banks 21x to 21z can be retained at a sufficient value when the flip pulse is applied.

A graph 90 in FIG. 9C also illustrates a temporal change of the estimated value of the voltage of the capacitor banks 21x to 21z. In the illustrated case, the pulse sequence involves application of a pre-pulse, for example, as in the spectral attenuated IR method (SPAIR). In this case, a pre-pulse, which is an inversion recovery (IR) pulse, is applied at time 91, and a flip pulse is applied at time 92. In this case, irrespective of the application of the pre-pulse, if the estimated value of the voltage of the capacitor banks 21x to 21z at a predetermined time does not recover to the specified threshold ($V_{TH2}$) at time 92 when the flip pulse is applied, the sequence control circuit 110 prolongs a repetition time (TR) to execute the imaging sequence.

In the second embodiment, the sequence control circuit 110 performs imaging sequence control, based on two criteria: (1) whether the estimated value of the voltage of the capacitor banks 21x to 21z becomes lower than a predetermined threshold (Vc–Min); and (2) whether the estimated value of the voltage of the capacitor banks 21x to 21z recovers to a predetermined threshold at the next application of the excitation pulse (Vc–Stable). The magnetic resonance imaging apparatus 100 thus can avoid a deficiency of the voltage value of the capacitor banks 21x to 21z and perform efficient control.

In the second embodiment, such control is performed on the sequence control circuit 110 to allow the sequence control circuit 110 to execute a pulse sequence in a wide range of degrees of freedom of parameters. For example, in diffusion weighted imaging (DWI), there is a factor called b value indicating the magnitude of a motion probing gradient (MPG) pulse applied by the sequence control circuit 110. For example, the higher the magnitude of the MPG pulse applied by the sequence control circuit 110, the greater the b value. Conversely, the lower the magnitude of the MPG pulse applied by the sequence control circuit 110, the smaller the b value. With the processing according to the second embodiment performed by the sequence control circuit 110, the sequence control circuit 110 can execute a pulse sequence with a wide range of b values, thereby increasing the degrees of freedom of executable b values in designing pulse sequences.

(Computer Program)

The instructions illustrated in the process procedure in the above-described embodiments can be executed based on a software program. A general-purpose calculator system may store this program in advance and read the program to achieve the same effects as the effects achieved by the magnetic resonance imaging apparatus 100 in the above-described embodiments. The instructions described in the above-described embodiments are recorded in the form of a computer-executable program on a magnetic disk (for example, a flexible disk or a hard disk), an optical disc (for example, a CD-ROM, a CD-R, a CD-RW, a DVD-ROM, a DVD±R, or a DVD±RW), a semiconductor memory, or any similar recording medium. The storage format of the storage medium may be any format readable by a computer or a built-in system. A computer can read the program from the recording medium and execute the instructions written in the program on the CPU based on the program to implement the same operation as in the magnetic resonance imaging apparatus 100 in the above-described embodiments. The computer may acquire or read the program via a network, as a matter of course.

For example, an operating system (OS) running on a computer, a database management system, or middleware (MW) for networks may execute part of the processing for implementing the above-described embodiments, based on the instructions in the program installed in a computer or a built-in system from a recording medium.

The term "recording medium" is intended to include a medium independent of a computer or a built-in system as well as a recording medium that stores or temporarily stores the program transmitted and downloaded via a local area network (LAN), the Internet, or the like.

The term "recording medium" in embodiments is intended to include a single recording medium as well as a plurality of recording media from which the processing in the above-described embodiments is performed. The medium may have any configuration.

The computer or the built-in system in embodiments is intended for executing each processing in the above-described embodiments, based on the program stored in a recording medium, and may be a one-piece device such as a personal computer or a microcomputer, a system including a plurality of devices connected to a network, or any other configuration.

The term "computer" in embodiments includes a personal computer as well as a processor or a microcomputer included in information processing equipment and collectively refers to equipment or apparatus capable of implementing the functions in embodiments by programs.

The magnetic resonance imaging apparatus according to at least one of the above-described embodiments can predict an electrical load on a gradient magnetic field generating system.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
a processing circuit configured to calculate, based on an imaging sequence to be executed in magnetic resonance imaging, a value of a current by using an equivalent circuit, and configured to determine, prior to an execution of the imaging sequence, based on the calculated value of the current, whether executing the imaging sequence is acceptable; and
a sequence control circuit configured to execute the imaging sequence when the processing circuit determines that executing the imaging sequence is acceptable,
the equivalent circuit being an equivalent circuit for a circuit that includes a gradient coil and that has a first circuit and a second circuit, the first circuit being connected to a power supply and having self-inductance, and the second circuit including at least one closed circuit having mutual inductance with the first circuit, the current flowing through the at least one closed circuit, wherein
the processing circuit is further configured to calculate an energy consumed in the second circuit based on the current flowing through the at least one closed circuit, and determine whether the imaging sequence is acceptable based on the calculated energy consumed in the second circuit.

2. The magnetic resonance imaging apparatus according to claim 1, wherein the processing circuit is further configured to divide a time in which the imaging sequence is executed into a plurality of time intervals in accordance with a temporal change of magnitude of an applied gradient magnetic field, and calculate the value of the current for each of the plurality of time intervals.

3. The magnetic resonance imaging apparatus according to claim 2, wherein when the processing circuit divides the time in which the imaging sequence is executed into the plurality of time intervals in accordance with the temporal change of the magnitude of the applied gradient magnetic field, the processing circuit is further configured to divide the time into first intervals in which the gradient magnetic field increases, second intervals in which the gradient magnetic field is constant, and third intervals in which the gradient magnetic field decreases.

4. The magnetic resonance imaging apparatus according to claim 1, wherein the processing circuit is further configured to calculate, based on the calculated value of the current, an estimated value of a voltage of a capacitor bank supplying a current to the gradient coil, and determine whether executing the imaging sequence is acceptable, based on the estimated value of the voltage, prior to an execution of the imaging sequence.

5. The magnetic resonance imaging apparatus according to claim 4, wherein when the estimated value of the voltage at a predetermined time does not recover to a specific threshold, the sequence control circuit is further configured to prolong a repetition time to execute the imaging sequence.

6. The magnetic resonance imaging apparatus according to claim 4, wherein when the estimated value of the voltage becomes lower than a certain threshold, the sequence control circuit is further configured to reduce an image resolution and execute the imaging sequence.

7. The magnetic resonance imaging apparatus according to claim 4, wherein the sequence control circuit is further configured to reduce an image resolution by enlarging a field of view.

8. The magnetic resonance imaging apparatus according to claim 4, wherein the processing circuit is further configured to divide a time in which the imaging sequence is executed into a plurality of time intervals in accordance with a temporal change of magnitude of an applied gradient magnetic field, and calculate an estimated value of a voltage of the capacitor bank for each of the time intervals.

9. The magnetic resonance imaging apparatus according to claim 1, wherein the processing circuit is further configured to calculate, based on the calculated value of the current, an estimated value of a voltage applied to the gradient coil.

10. The magnetic resonance imaging apparatus according to claim 1, wherein the processing circuit is further configured to calculate, based on the calculated value of the current, an estimated value of a current flowing through the gradient coil.

11. The magnetic resonance imaging apparatus according to claim 1, wherein the processing circuit is further configured to calculate, based on the calculated value of the current, an estimated value of an energy consumed in the gradient coil.

12. The magnetic resonance imaging apparatus according to claim 1, wherein the processing circuit is further configured to calculate, based on the calculated value of the current, a current-voltage characteristic of the gradient coil.

13. A magnetic resonance imaging method performed in a magnetic resonance imaging apparatus, the magnetic resonance imaging method comprising:
    calculating, by processing circuitry, based on an imaging sequence to be executed in magnetic resonance imaging, a value of a current by using an equivalent circuit;
    determining, by the processing circuitry, prior to an execution of the imaging sequence, based on the calculated value of the current, whether executing the imaging sequence is acceptable; and
    executing, by the processing circuitry, the imaging sequence when determining that executing the imaging sequence is acceptable,
    the equivalent circuit being an equivalent circuit for a circuit that includes a gradient coil and that has a first circuit and a second circuit, the first circuit being connected to a power supply and having self-inductance, the second circuit including at least one closed circuit having mutual inductance with the first circuit, the current flowing through the at least one closed circuit, wherein the magnetic resonance imaging method further includes
    calculating, by the processing circuitry, an energy consumed in the second circuit based on the current flowing through the at least one closed circuit; and
    determining, by the processing circuitry, whether the imaging sequence is acceptable based on the calculated energy consumed in the second circuit.

* * * * *